US008559098B2

(12) United States Patent
Klehr et al.

(10) Patent No.: US 8,559,098 B2
(45) Date of Patent: Oct. 15, 2013

(54) DEVICE AND METHOD FOR SELECTIVE TRANSMISSION OF AN OPTICAL SIGNAL

(75) Inventors: Andreas Klehr, Berlin (DE); Armin Liero, Berlin (DE)

(73) Assignee: Forschungsverbund Berlin E.V., Berlin (DE)

(*) Notice: Subject to any disclaimer, the term of this patent is extended or adjusted under 35 U.S.C. 154(b) by 286 days.

(21) Appl. No.: 13/127,580

(22) PCT Filed: Oct. 30, 2009

(86) PCT No.: PCT/EP2009/064391
§ 371 (c)(1),
(2), (4) Date: Jul. 19, 2011

(87) PCT Pub. No.: WO2010/052176
PCT Pub. Date: May 14, 2010

(65) Prior Publication Data
US 2011/0261439 A1    Oct. 27, 2011

(30) Foreign Application Priority Data
Nov. 4, 2008   (DE) .......................... 10 2008 056 096

(51) Int. Cl.
*G02F 1/025*     (2006.01)
*H01S 5/00*      (2006.01)

(52) U.S. Cl.
USPC .......................................... 359/344; 359/245

(58) Field of Classification Search
USPC ........................... 359/245, 248, 250, 259, 344
See application file for complete search history.

(56) References Cited

U.S. PATENT DOCUMENTS

| 3,724,926 | A  |   | 4/1973 | Lee |
| 5,546,415 | A  |   | 8/1996 | Delfyett et al. |
| 6,275,317 | B1 | * | 8/2001 | Doerr et al. ................... 398/201 |
| 6,590,691 | B1 | * | 7/2003 | Nagra et al. .................. 359/237 |

(Continued)

FOREIGN PATENT DOCUMENTS

| EP | 1065765        | 1/2001 |
| EP | 1065765 A2 *   | 1/2001 |

OTHER PUBLICATIONS

Schoell et al. "Gain-switched semiconductor laser amplifier as an ultrafast dynamical optical gate", Applied Physics B, vol. 46, pp. 69-77 (1988).*

(Continued)

*Primary Examiner* — Eric Bolda
(74) *Attorney, Agent, or Firm* — VLP Law Group LLP

(57) ABSTRACT

The present invention relates to a device and a method for selective transmission of an optical signal.
It is an object of the present invention to provide a light modulator and a method for light modulation capable of selecting very short optical pulses of up to the femtosecond range with a low repetition frequency, wherein the repetition frequency can be variable in a range between several Hz up to the GHz range.
To this end, the device has a first optical waveguide (3), a first drive circuit (14), a second optical waveguide (1, 2) and a second drive circuit (15), wherein the spacing between a switching element of the first drive circuit (14) and the first optical waveguide (3) is less than 3 mm, and the distance between a switching element of the second drive circuit (15) and the second optical waveguide (1, 2) is less than 3 mm, and the first optical waveguide (3) has a first absorber section (5), a pulse picker section (4) and a second absorber section (18).

15 Claims, 6 Drawing Sheets

(56) References Cited

U.S. PATENT DOCUMENTS

Figure 1:
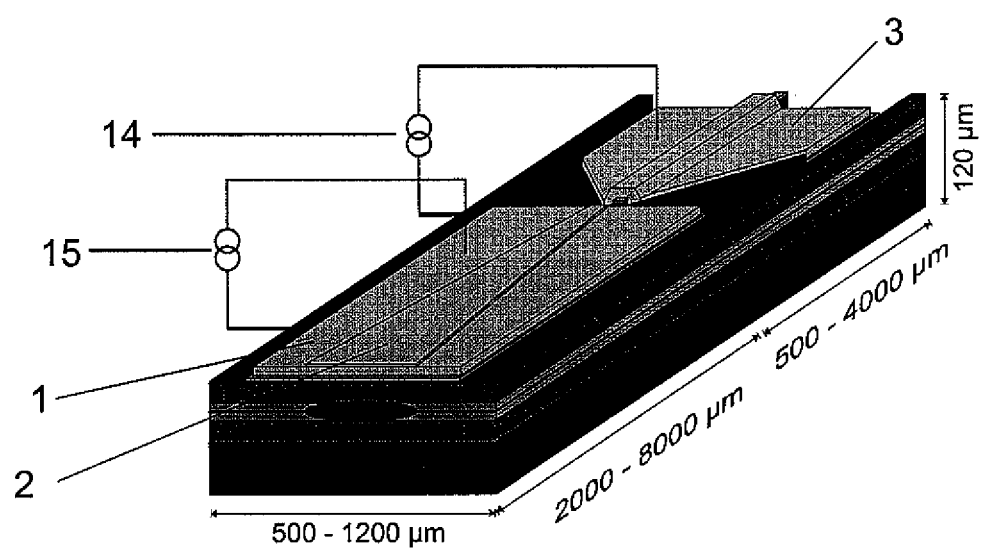

| | | | |
|---|---|---|---|
| 7,324,258 B2* | 1/2008 | Kwon et al. | 359/248 |
| 7,373,090 B2* | 5/2008 | Kazemi-Nia et al. | 398/198 |
| 7,633,667 B2* | 12/2009 | Koste et al. | 359/254 |
| 2003/0007228 A1* | 1/2003 | Shirai | 359/237 |
| 2003/0180054 A1 | 9/2003 | Watanabe | |
| 2007/0171515 A1* | 7/2007 | Kang et al. | 359/333 |
| 2009/0103160 A1* | 4/2009 | Koste et al. | 359/245 |

OTHER PUBLICATIONS

Schöll et al., Gain-switched semiconductor laser amplifier as an ultrafast dynamical optical gate, Appl. Phys. B 46, pp. 69-77 (1988) XP 000045124.

International Search Report dated Feb. 12, 2010.

* cited by examiner

DEVICE AND METHOD FOR SELECTIVE TRANSMISSION OF AN OPTICAL SIGNAL

The present invention relates to a device and a method for selective transmission of an optical signal; more particularly, the present invention relates to a device and a method for selective transmission of individual pulses of pulsed laser radiation with ultra-short pulse widths (up to the femtosecond range, preferably with pulse widths between 100 ps-500 fs) with extremely variable repetition frequencies up to the GHz range (preferably up to 300 MHz) for optical wavelengths between 200 nm-10 THz.

Many applications, for example certain areas of laser material processing, of photographic and display technology, of biomedical screening techniques based on fluorescence spectroscopy, laser distance measurements, LIDAR as well as optical chemical analysis require very short optical pulses (up to the femtosecond range) of low repetition frequency (up to 100 MHz). Because conventional short pulse laser systems generate pulses with a high repetition frequency, fast optical modulators (pulse pickers) capable of selecting and transmitting individual pulses from the rapid pulse trains, i.e. attaining a frequency division, are necessary. The individual pulses can then be separately further processed. Unlike purely mode-coupled laser systems, pulses with almost any shape, length and repetition rate can be generated with systems having a modulator.

It is known to use Pockel cells for pulse selection, which operate with nonlinear, voltage-dependent optical crystals. Disadvantageously, high voltages are required. As a result, the capacitances which must be recharged are also very large. The attainable minimum pulse width (and hence also the maximum input pulse repetition frequency) as well as the repetition frequency of the switch (and hence the maximum output pulse repetition frequency) are very limited. Pulse widths of several 10 ns (typically 30 ns) can be attained. The repetition frequency is several MHz.

Also known for pulse selection is the use of acousto-optical modulators. A standing ultrasound field is generated by applying an HF voltage. This field then deflects the optical laser pulses. Buildup of a standing field requires time. In this way, short pulses of at most several ns can be attained. The repetition frequency is limited by the maximum average power, so that significantly more than 10 MHz can also not be achieved.

The use of electro-optical modulators for pulse selection is also known. In the simplest case, an electro-optical modulator is made of a crystal, e.g., lithium niobate, wherein the index of refraction depends on the applied electric field strength. The transparency of the crystal then also depends on the applied field strength. Electro-optical crystals therefore change their optical thickness instantaneously as a function of the applied external electric field strength. The effect depends on the polarization of the incident radiation. The path difference is exactly 180° for two orthogonally polarized beams when the so-called $\lambda/2$ voltage is applied. With suitable crystal adjustment, the polarization plane is rotated by 90° for linearly polarized incident light. A polarizer completely removes the light from the beam path. The intensity of the transmitted light can then be modulated by varying the applied voltage. The modulator can therefore be readily understood as a phase delay plate with an electrically adjustable delay. Optical pulses can then be selected by varying the voltage.

Also known for pulse selection is the use of an integrated electro-optical light modulator based on waveguides. The basic element is a fiber-coupled Mach-Zehnder amplitude modulator based on the ferroelectric crystal material lithium niobate. Modulation occurs by electro-optical detuning of the waveguide interferometer with an electric voltage applied to the electrode system.

Disadvantageously, the aforedescribed light modulators are relatively large and require complex adjustments, and the modulation frequency for separating individual pulses is limited.

U.S. 2005/0206989 A1 discloses a multi-bandgap modulator which has a greater wavelength range or is able to compensate chirp due to separately controllable regions with different bandgap.

EP 1 065 765 A2 discloses a laser with improved modulation across a large wavelength range. To this end, laser diode and modulator are grown as a single structure, i.e., on a common substrate, wherein the modulator has at least at first region and a second region, wherein the light of the laser diode is modulated by applying a suitable reverse voltage.

U.S. 2003/0180054 A1 discloses an optical modulator for ultrafast pulses, wherein the drive circuit and the modulator are arranged on a common substrate and the distance between the drive circuit and the optical modulators is less than one tenth of the wavelength of the modulation frequency. The maximum modulation frequency can be increased by reducing the inductances of the electrical wires between the drive circuit and the optical modulator.

Disadvantageously, however, depending on the intensity of the pulses, charge carriers can be formed in the pulse picker section—i.e. in the modulator—due to recombination processes which cause an unintended transparency of the pulse picker section, even if no charge carriers are injected via the contacts. The optical modulator therefore has a relatively low dielectric strength.

EP 1 210 754 B1 describes an EA modulator with a large extinction ratio and an improved nonlinear extinction curve, wherein a semiconductor laser source, the EA modulator and a SOA are integrated on the same substrate. This device can therefore not be used to modulate externally generated laser pulses, because they cannot be coupled in. In addition, only small powers can be modulated with this device.

It is an object of the present invention to provide a light modulator and a method for light modulation capable of selecting very short high-power optical pulses upwards to the femtosecond range with a low repetition frequency, wherein the repetition frequency should be variable from several Hz into the GHz range. In addition, the device according to the invention should be constructed at the lowest cost possible compared to conventional devices and have a high dielectric strength.

These objects are solved according to the invention with an optical modulator and a method for light modulation having the features recited in claims 1 and 11. Advantageous embodiments of the invention are recited in the dependent claims.

According to one particular advantage of the device according to the invention, ultrashort pulses with a pulse width of less than 10 ps with a repetition frequency up to the GHz range with simultaneously high dielectric strength can be selected.

To this end, the optical modulator according to the invention has an input coupling facet and a first optical waveguide, which is made from electrically semiconducting materials and which cooperates with the input coupling facet and is connected via electrical contacts with a first drive circuit, wherein the first waveguide is constructed such that the optical transparency of the first waveguide is increased by injecting electrical charge carriers into the first waveguide (by at least 10%, preferably 50%), wherein the first drive circuit has at least one electrical switching element and is configured to inject into the first waveguide electrical charge carriers via the contacts for very short time intervals and according to a predetermined repetition frequency. In addition, the optical modulator according to the invention has a second optical waveguide, wherein the first waveguide is arranged between the input coupling facet and the second waveguide, and wherein the second optical waveguide is formed of electrically semiconducting materials and is connected via electrical contacts with a second drive circuit, wherein the second drive circuit has at least one switching element, and the second waveguide and the second drive circuit are configured to amplify the light coupled from the first waveguide into the second waveguide and/or to increase its contrast, wherein furthermore an output coupling facet is provided for coupling the optical radiation out of the second waveguide.

According to the invention, very short optical pulses with pulse widths up to the femtosecond range with a low repetition frequency can be selected by making the spacing between the switching element of the first drive circuit and the first optical waveguide less than 3 mm and the spacing between the switching element of the second drive circuit and the second optical waveguide less than 3 mm, and a high dielectric strength can be attained according to the invention by constructing the first optical waveguide with a first absorber section, a pulse picker section (corresponding to the waveguide section that can be switched via the contacts between transparent and non-transparent) and a second absorber section, wherein the first drive circuit is configured to increase the optical transparency of the pulse picker section in the forward direction through injection of electrical carriers (i.e., to switch the pulse picker section between transparent and non-transparent), wherein the first drive circuit is configured to apply an electric field to both the first absorber section and the second absorber section in the opposite direction while the charge carriers are injected into the pulse picker section, thus efficiently preventing breakdown of the signal to be modulated. In particular, charge carriers may otherwise form in the pulse picker section due to recombination processes, which cause an undesirable transparency of the pulse picker section, even if no charge carriers are injected via the contacts.

The electric field in the opposite direction extracts the charge carriers, so that transparency of the pulse picker section cannot be attained unless charge carriers are injected into the pulse picker section by an electric current.

Preferably, the first absorber section is arranged between the input coupling facet and the pulse picker section and the second absorber section is arranged between the pulse picker section and the output coupling facet. Preferably, a section for input coupling adjustment (preferably an HF input element) is arranged between the input coupling facet and the first absorber section. This input section is connected as a photodiode which should have the smallest possible active area for high-frequency detection. The length of the section for input coupling adjustment along the optical axis in the central region (underneath the ridge waveguide) is therefore preferably smaller than 40 µm. This is attained with the contact structure illustrated in FIG. 3, which provides lateral contact formation.

In other words, the device according to the invention is an optical modulator for modulating externally generated pulsed laser radiation coupled in via the input coupling facet, wherein the optical modulator is constructed as a waveguide, and wherein the optical transparency of the individual sections can be controlled via electrical contacts (injection of charge carriers).

Preferably, the spacing between the switching element of the first drive circuit and the first optical waveguide is less than 2 mm (more preferred less than 1 mm). The spacing between the switching element of the second drive circuit and the second optical waveguide is preferably also less than 2 mm (more preferred less than 1 mm). According to the present invention, the spacing between the electrical switching element and the waveguide is to be understood as the distance between the output (e.g., the drain) of the electrical switching element and the center of the region of the waveguide oriented perpendicular to the light propagation direction, through which (via the light input facet) the radiation to be modulated is coupled into the waveguide.

Preferably, the light input facet and the light output facet have an optical transmission for the optical radiation to be modulated (which can be between 200 nm-10 THz) of greater than 80%, more preferred of greater than 90%.

Preferably, the first waveguide has, when switched into the transparent state (i.e., during the injection of charge carriers), an optical transmission for the optical radiation to be modulated (which can be between 200 nm-10 THz) of greater than 50%, more preferred of greater than 90%, and, when switched into the non-transparent state, an optical transmission of less than 50%, more preferred of less than 30%, and even more preferred of less than 1%.

Preferably, the first drive circuit is constructed to inject into the first waveguide electrical charge carriers for a respective predetermined time interval and with a predetermined repetition frequency, wherein the time interval is preferably between 10 ps and 1 ns and the repetition frequency is preferably between 1 kHz and 1 GHz.

Arranging the electric switching elements of the drive circuit and the optical switch (waveguide) directly next to each other is quite complex due to the required very precise alignment in the mounting process, so that arranging these components with a spacing of less than 3 mm would generally not be an obvious choice. However, it has been observed that with smaller inductances, repetition frequencies up to the GHz range with extremely short pulses into the picosecond range can be achieved for switching into the transparent state.

Preferably, the first optical waveguide and the second optical waveguide are integrated on the same substrate. In a particularly preferred embodiment, the first optical waveguide and the second optical waveguide are formed by a monolithic multi-section semiconductor component, i.e., the first and the second waveguide may be formed with common epitaxy and a common layout, while being spatially separated from each other.

Preferably, the first drive circuit has a first drive generator and the second drive circuit has a second drive generator, wherein means for adjusting the frequency of the first drive generator and/or means for adjusting the frequency of the second drive generator are provided. It is then possible to vary the repetition frequency of the pulse picker. Preferably, the first drive generator and the second drive generator are synchronized with each other, wherein the frequency of the first drive generator is an integer multiple of the frequency of the second drive generator.

Preferably, the first optical waveguide and the second optical waveguide have a spacing between 10 µm and 500 µm. Preferably, the first absorber section and the pulse picker section and/or the pulse picker section and second absorber section have a spacing between 10 µm than 500 µm.

Preferably, the first optical waveguide is formed as a ridge waveguide.

Lateral waveguiding is here achieved with a discontinuity in the refractive index in the epitaxial plane produced by selectively etching a ridge into the waveguide. Preferably, the ridge widths are in a range of 1.5-10 µm. The ridge geometry not only constricts the optical wave, but also limits the current flow to the ridge region. Low laser thresholds are thereby obtained while also improving waveguiding. This geometry requires only small modulation currents for modulation (switching between transparent and non-transparent). Ridge waveguide lasers have an excellent, almost Gaussian beam profile with a beam quality factor $M^2 \sim 1$.

Preferably, the first optical waveguide is formed as a broad area laser.

Broad area lasers have inferior optical waveguiding and require higher modulation currents. The widths for the electrical contact are typically in a range of >10-400 µm. Advantageously, these lasers can switch and/or generate higher optical powers. A disadvantage is the inferior beam profile ($M^2 < 10$) of the emitted radiation.

Preferably, the second waveguide is constructed as a tapered laser. When using a trapezoidal section as the second waveguide, the radiation that is coupled from the ridge waveguide into the tapered waveguide with a good beam profile can be amplified without significant changes in the beam profile. Amplified radiation with a good beam profile ($M^2 < 2-3$) is obtained.

The device according to the invention is preferably used for modulating optical laser pulses greater than 20 mW. The charge carriers for modulating the optical laser pulses are preferably intermittently injected into the pulse picker section preferably with a current of 100 mA to 1 A, more preferably with a current greater than 1 A (in a time interval less than 5 ns).

Figure 2:
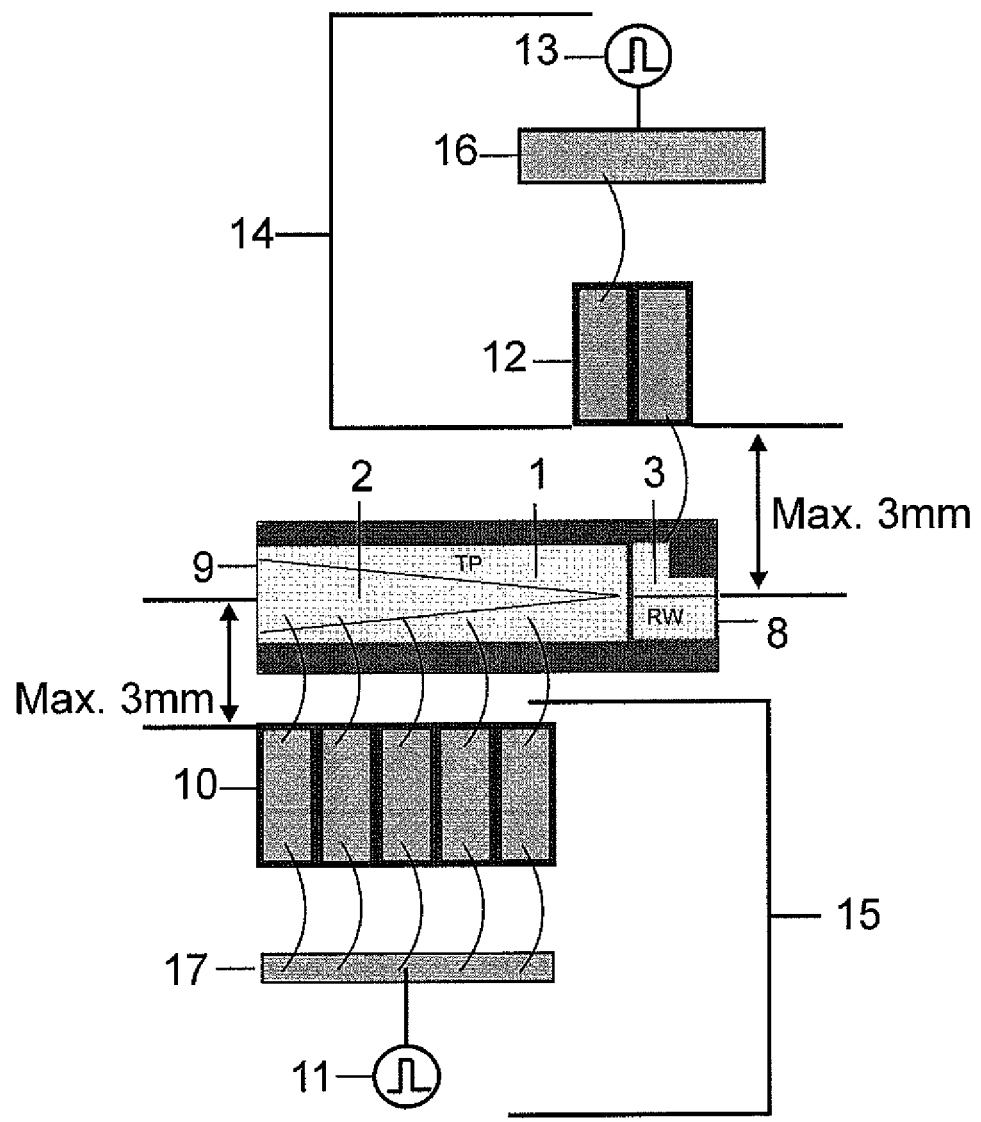
Figure 3:
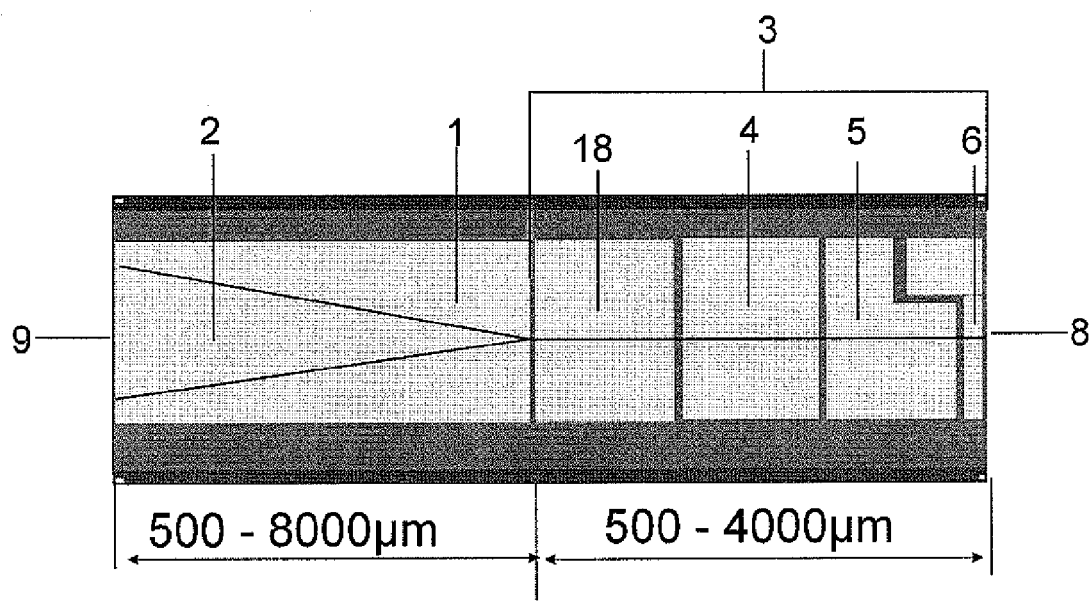
Figure 3A:
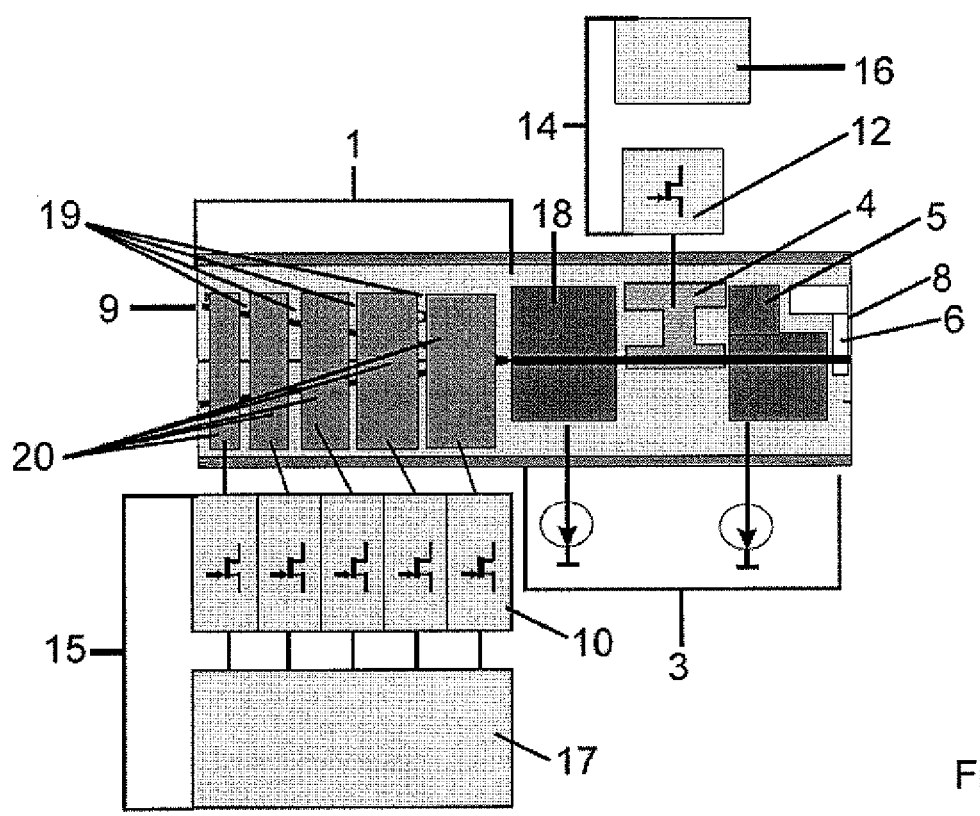
Figure 4:
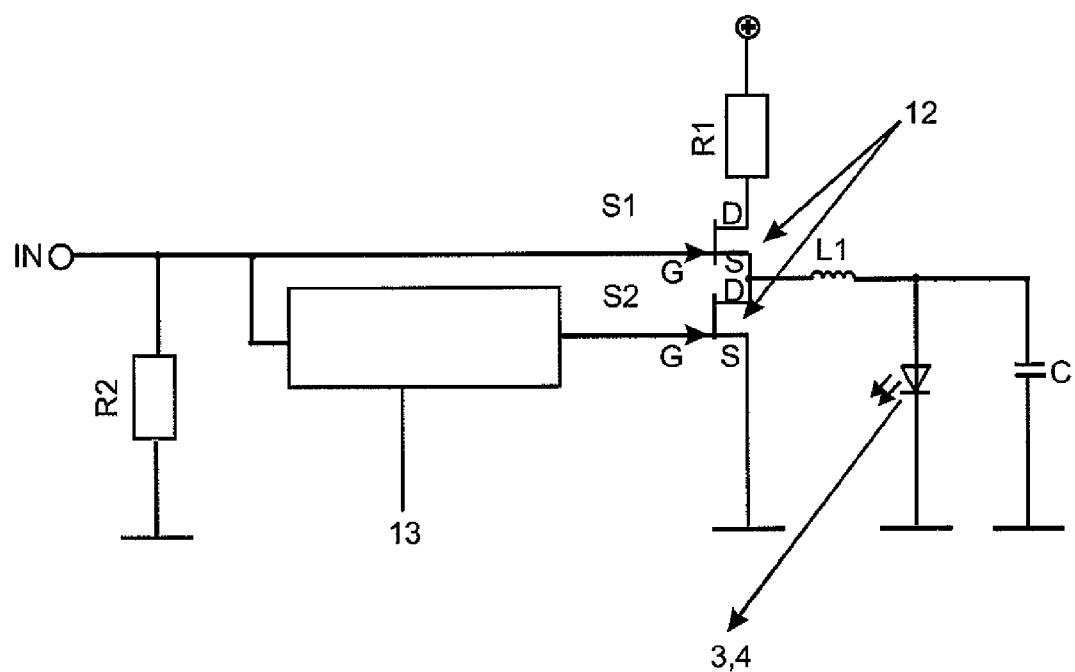
Figure 5:
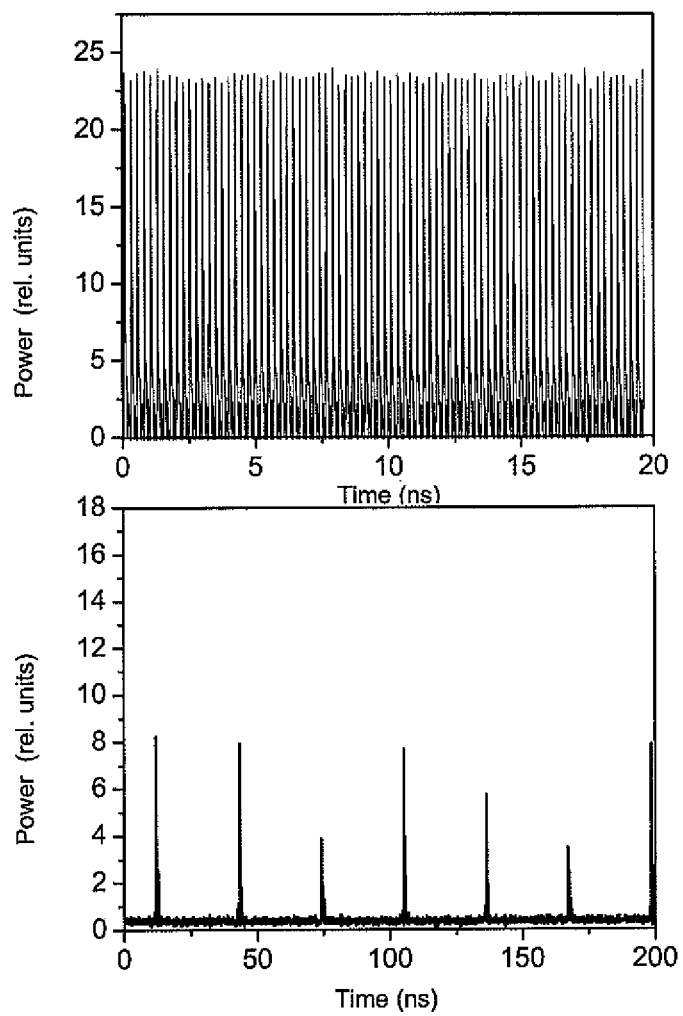

The invention will now be described in more detail with reference to exemplary embodiments illustrated in the figures. It is shown in:

FIG. 1 the device according to the invention for selective transmission of an optical signal in a schematic, perspective diagram, FIG. 2 a schematic diagram of the device according to FIG. 1, in a top view, FIG. 3 a schematic diagram with a detailed illustration of the contact layout of the first optical waveguide for selective transmission of an optical signal, accompanied by an increased dialectic strength, in a top view, FIG. 3a a schematic diagram with a detailed illustration of the contact layout of the first optical waveguide for selective transmission of an optical signal, accompanied by an increased dialectic strength, and a detailed diagram of the contact layout of the second optical waveguide with a plurality of separate contacts and absorbing regions above the trapezoidal section, in a top view, FIG. 4 an exemplary embodiment of a drive circuit of the device according to the invention, and FIG. 5 a diagram of the pulse sequence to be modulated from a mode-coupled diode laser with a frequency of 4 GHz (top diagram) as well as the transmitted pulse sequence (selected pulses) after passing through the device according to the invention (bottom diagram).

FIGS. 1 and 2 show in form of a schematic diagram an exemplary embodiment of the device according to the invention for selective transmission of an optical signal.

The arrangement is constructed with monolithic 2- or multi-section semiconductor components (FIG. 3). At least one first section is formed by a waveguide 3 (first waveguide, e.g., ridge waveguide) which provides a high temporal resolution up to the picosecond range, whereas at least one second section 1 with an amplifying region 2 (second waveguide) increases the optical power in the monolithic component after passing through the first section and improves the contrast in the slower time range (greater than 1 ns). In other words, the first section 3 forms an ultra-fast optical switch which can be switched between transparent and non-transparent up to the picosecond range, whereas the second section amplifies the pulses reaching the second section when the first section is switched into a transparent state, in a slower time range (greater than 1 ns), and/or improves the contrast. In other words, an individual pulse from the ultra-fast pulse sequence is transmitted to the second section by switching the first section into the transparent state, whereas a number of subsequent pulses are absorbed or attenuated because the first section is switched into the non-transparent state. The frequency or the order with which individual pulses from the ultra-fast pulses are transmitted may according to the invention have a frequency up to the GHz range. The transmitted pulses are amplified in the second section in a slower time range (greater than 1 ns) and/or their contrast is improved.

Fast recharging of the capacitances of the waveguide 3 is important for a high speed of the switching operation into the transparent state of the first section 3. To keep the time constant small, the waveguide 3 and the drive circuit 14 are constructed as a single unit. Small inductances L1 and hence short switching times are attained through extremely small feature sizes with small contact areas and very short lead wires (FIG. 4).

The switch S1 allows very fast turn-on of the waveguide current for the first waveguide 3. The positive flank of the input pulse closes the switch S1, with the current then flowing via R1, S1 and L1 via the waveguide 3 and the parasitic capacitor C. After an adjustable time constant, S2 also closes and the current now flows via the low-resistance S2, thereby also discharging the parasitic capacitor C. The waveguide 3 can then be transparent only during a short time interval which is essentially determined by the time constant of the drive generator 13. Switching of the waveguide 3 is then triggered only by one flank and is hence independent of the length of the input pulse. The circuit becomes again operational a short time after the pulse. In this way, high repetition frequencies can be realized. This delay can also be generated separately by external components to attain greater variability.

Control of the normally-on FETs (S1, S2) can be improved by applying offset voltages. The blocking characteristic of the laser diodes (waveguides) can be positively affected by introducing negative offset voltages.

A high dielectric strength can be attained according to the invention in that the first optical waveguide has a first absorber section 5, a pulse picker section 4 with a contact having the smallest possible area for reducing the inductances, (corresponds to the waveguide section to be switched between transparent and non-transparent via the contacts) as well as a second absorber section 18, wherein the first drive circuit 14 is constructed to increase the optical transparency of the pulse picker section 4 through injection of electric charge carriers in the forward direction (i.e., to switch the pulse picker section transparent or non-transparent), wherein the first drive circuit 14 is constructed to apply to the first absorber section 5 and the second absorber section 18 an electric field in the opposite direction while charge carriers are injected into the pulse picker section 4, thereby efficiently preventing breakdown of the signal to be modulated (FIGS. 3 and 3a). Otherwise, charge carriers could be generated in the pulse picker section 4 due to recombination processes, which could cause an unintended transparency of the pulse picker section 4, even if no charge carriers are injected via the contacts. The electric field applied to the regions 5 and 18 in the opposite direction extracts the charge carriers, so that the pulse picker section 4 cannot become transparent unless charge carriers are injected into the pulse picker section 4 by an electric current.

In another preferred modified embodiment, the electric contact areas 20 above the amplifier (second waveguide 1) are sectioned, with absorbing regions 19 remaining between the contact areas (FIG. 3*a*), thereby realizing separately controllable amplifier stages. The layout is implemented such that each contact area above the area 2 V has the same area (identical pumped area). The number of contact areas is matched to the number of the integrated output stage transistors 10. The drive circuit 15 for the second waveguide is constructed so that the individual amplifier stages can be controlled in parallel; alternatively, an amplifier cascade can be realized, wherein the amplifier stages are controlled in cascaded form, i.e. successively. The trapezoidal section 2 (amplifier) can be divided into 1 . . . n stages, preferably between 3 and 10 stages.

The second section (waveguide 1, 2, e.g., trapezoidal section) increases the maximum output power and enhances the contrast for input pulses that are farther removed from the pulse to be selected. The drive circuit 15 is constructed analogous to FIG. 4. The driver stage 15 has a higher current efficiency because of the higher required currents.

In particular, the electric driver (semiconductor transistors S1, S2) and the optical element (waveguide 3) form an integrated functional unit. If an output signal from a CW laser signal is inputted, then the device of the invention can also be used to generate pulsed laser radiation from CW laser radiation.

FIG. 5 shows a measurement of a pulse sequence from an (unillustrated) mode-coupled diode laser with a repetition frequency of 4 GHz (top diagram) and the pulse sequence obtained after passing through the pulse picker according to the invention (pulses selected from the input signal—bottom diagram).

LIST OF REFERENCES SYMBOLS

1 Trapezoidal section of the (second) optical waveguide/optical amplifier
2 Amplifying region of the (second) optical waveguide/optical amplifier
3 (First) optical waveguide section/optical switch/pulse picker
4 Pulse picker section
5 First absorber section
6 Section for input coupling adjustment
8 Input coupling facet
9 Output coupling facet
10 Drive transistor for the second waveguide
11 Drive generator for the second waveguide
12 Drive transistor for the first waveguide
13 Drive generator for the first waveguide
14 Drive circuit for the first waveguide
15 Drive circuit for the second waveguide
16 Preamplifier for the first waveguide
17 Preamplifier for the second waveguide
18 Second absorber section
19 Absorbing regions for suppressing ASE
20 Electric contact area or areas of the amplifier
RW Ridge waveguide-waveguide
TP Trapezoidal region
R1, R2 Resistor
S1, S2 Transistor
L1 Bond inductance
C Parasitic capacitance of the laser diode

The invention claimed is:

1. A device for selective transmission of an optical signal with variable adjustable frequency, comprising:
an input coupling facet for coupling an optical signal in, an electro-optical modulator configured as a first optical waveguide for modulating an optical signal coupled in, the electro-optical modulator cooperating with the input coupling facet and being connected via electrical contacts with a first drive circuit, wherein the first waveguide is formed of a material having an optical transmission that is increased through injection of electrical charge carriers,
wherein the first drive circuit comprises at least one electrical switching element for injection of electrical charge carriers into the first waveguide for a corresponding predetermined time interval and with a predetermined repetition frequency, an optical amplifier formed as a second optical waveguide for amplification and/or contrast enhancement of the optical signal coupled from the first waveguide into the second waveguide, wherein the first waveguide is arranged between the input coupling facet and the second waveguide, and wherein the second optical waveguide is connected via electrical contacts with a second drive circuit, wherein the second drive circuit comprises at least one switching element, and
an output coupling facet for coupling the optical radiation out of the second waveguide,
wherein the spacing between the switching element of the first drive circuit and the first optical waveguide is less than 3 mm, wherein the first optical waveguide comprises a first absorber section, a pulse picker section and a second absorber section, wherein the first drive circuit is configured to increase the optical transparency of the pulse picker section through injection of electrical charge carriers, and wherein the first drive circuit is furthermore configured to apply to the first absorber section and the second absorber section an electric field in the opposite direction while the charge carriers are injected into the pulse picker section.

2. The device of claim 1, wherein the second optical waveguide is constructed as a trapezoidal laser with a trapezoidal section, wherein the second optical waveguide has a plurality of separate amplifier stages with absorbing regions arranged in between, with each of the absorbing regions being connected to a separately switched drive transistor.

3. The device of claim 2, wherein the plurality of amplifier stages has identical contact surfaces for injection of charge carriers.

4. The device of claim 1, wherein the distance between the switching element of the first drive circuit and the first optical waveguide is less than 1 mm, and the distance between the switching element of the second drive circuit and the second optical waveguide is less than 1 mm.

5. The device of claim 1, wherein the first optical waveguide and the second optical waveguide are integrated on the same substrate and the first optical waveguide and the second optical waveguide are formed from electrically semiconducting materials.

6. The device of claim 1, wherein a section is provided for input coupling adjustment, wherein the section for input coupling adjustment is arranged between the input coupling facet and the first optical waveguide and the section for input coupling adjustment is integrated on the same substrate as the first optical waveguide and the second optical waveguide.

7. The device of claim 1, wherein the first optical waveguide and the second optical waveguide have a spacing between 10 μm and 500 μm.

8. The device of claim 1, wherein the first drive circuit for intermittent injection of electrical charge carriers into the first waveguide is configured such that the first waveguide has during the injection of charge carriers an optical transmission greater than a first limit value, and the first waveguide has during a time interval when the charge carriers are injected an optical transparency which is smaller than a second limit value, wherein the first limit value is greater than the second limit value.

9. The device of claim 1, wherein the first optical waveguide is constructed as a ridge waveguide and/or as a broad area laser and the second waveguide is constructed as a trapezoidal laser.

10. The device of claim 1, wherein the switching element of the first drive circuit and/or the switching element of the second drive circuit are constructed as transistors.

11. A method for producing pulsed laser radiation by coupling an optical signal into a device for selective transmission of an optical signal with variable adjustable frequency, wherein the device comprises:

an input coupling facet for coupling an optical signal in, an electro-optical modulator configured as a first optical waveguide for modulating an optical signal coupled in, the electro-optical modulator cooperating with the input coupling facet and being connected via electrical contacts with a first drive circuit, wherein the first waveguide is formed of a material having an optical transmission that is increased through injection of electrical charge carriers, wherein the first drive circuit comprises at least one electrical switching element for injection of electrical charge carriers into the first waveguide for a corresponding predetermined time interval and with a predetermined repetition frequency, an optical amplifier formed as a second optical waveguide for amplification and/or contrast enhancement of the optical signal coupled from the first waveguide into the second waveguide, wherein the first waveguide is arranged between the input coupling facet and the second waveguide, and wherein the second optical waveguide is connected via electrical contacts with a second drive circuit, wherein the second drive circuit comprises at least one switching element, and an output coupling facet for coupling the optical radiation out of the second waveguide, wherein the spacing between the switching element of the first drive circuit and the first optical waveguide is less than 3 mm, wherein the first optical waveguide comprises a first absorber section, a pulse picker section and a second absorber section, wherein the first drive circuit is configured to increase the optical transparency of the pulse picker section through injection of electrical charge carriers, and wherein the first drive circuit is furthermore configured to apply to the first absorber section and the second absorber section an electric field in the opposite direction while the charge carriers are injected into the pulse picker section;

the method comprising the steps of:

intermittent injection of electrical charge carriers into the first waveguide for selective transmission of the coupled optical signal, wherein the selected optical signal is amplified in the second optical waveguide and/or the contrast of the selected optical signal in the second optical waveguide is increased.

12. The method of claim 11, wherein the optical transparency of the pulse picker section is increased through injection of electrical charge carriers into the pulse picker section in the forward direction, while simultaneously an electric field is applied to the first absorber section and to the second absorber section in the opposite direction for increasing the dielectric strength.

13. The method of claim 11, wherein pulsed laser radiation with a pulse width of less than 10 ns is used as optical signal to be coupled in.

14. The method of claim 13, wherein pulsed laser radiation with a pulse width of less than 1 ns is used as optical signal to be coupled in.

15. The method of claim 13, wherein pulsed laser radiation with a pulse width of less than 1 ps is used as optical signal to be coupled in.

* * * * *